United States Patent [19]
Wuidart

[11] Patent Number: 5,912,859
[45] Date of Patent: Jun. 15, 1999

[54] METHOD FOR THE RESETTING OF A SHIFT REGISTER AND ASSOCIATED REGISTER

[75] Inventor: Sylvie Wuidart, Pourrières, France

[73] Assignee: SGS-Thomson Microelectronics S.A., Saint Genis, France

[21] Appl. No.: 09/049,644

[22] Filed: Mar. 27, 1998

Related U.S. Application Data

[62] Division of application No. 08/732,601, Oct. 16, 1996, Pat. No. 5,778,037.

[30] Foreign Application Priority Data

Oct. 16, 1995 [FR] France .................................. 95 12104

[51] Int. Cl.$^6$ ...................................................... G11C 8/00
[52] U.S. Cl. ...................... 365/233; 365/189.12; 365/240
[58] Field of Search ............................... 365/233, 189.12, 365/189.05, 239, 240

[56] References Cited

U.S. PATENT DOCUMENTS

| | | | |
|---|---|---|---|
| 5,394,450 | 2/1995 | Pasternak | 365/189.12 X |
| 5,396,460 | 3/1995 | Haradat et al. | 365/240 X |
| 5,416,737 | 5/1995 | Lingstaedt et al. | 365/189.12 X |

*Primary Examiner*—Huan Hoang
*Attorney, Agent, or Firm*—Wolf, Greenfield & Sacks, P.C.

[57] ABSTRACT

A method for the resetting of a group of series-connected non-transparent synchronous memory cells. The method includes modifying the clock signals that control the transfer gates of these cells on the activation of a resetting signal to set all the transfer gates in the on state. The method is particularly suited to the resetting of long shift registers such as those used in cryptographic applications, especially in micro-circuit cards, and the reset circuitry can be implemented using conventional logic gates.

2 Claims, 1 Drawing Sheet

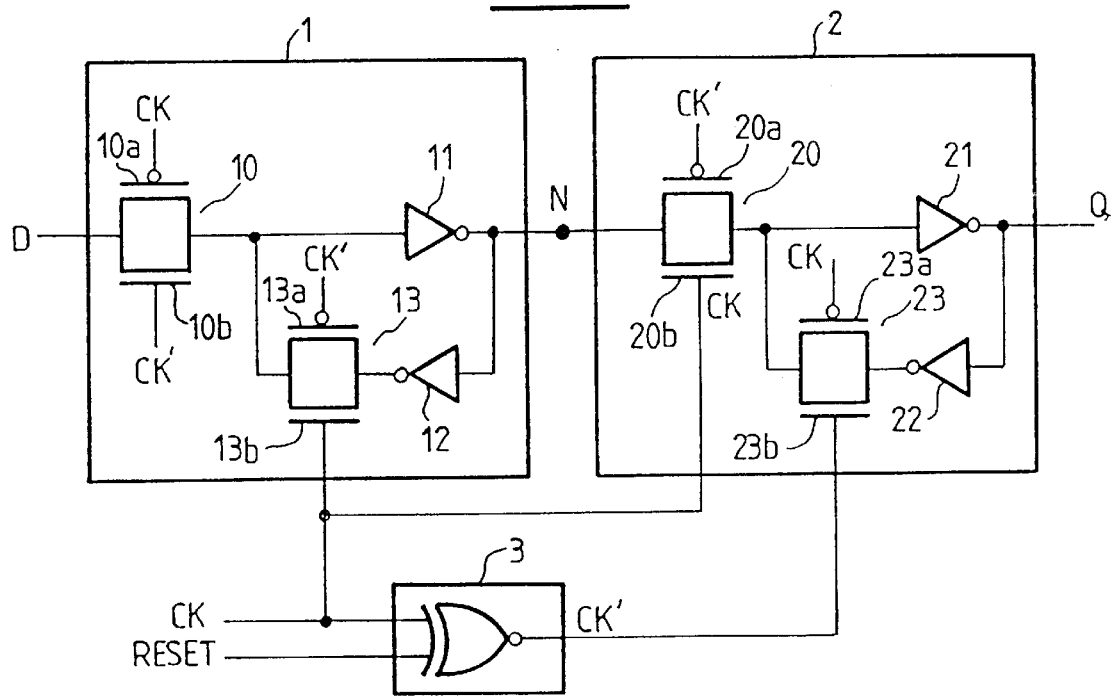
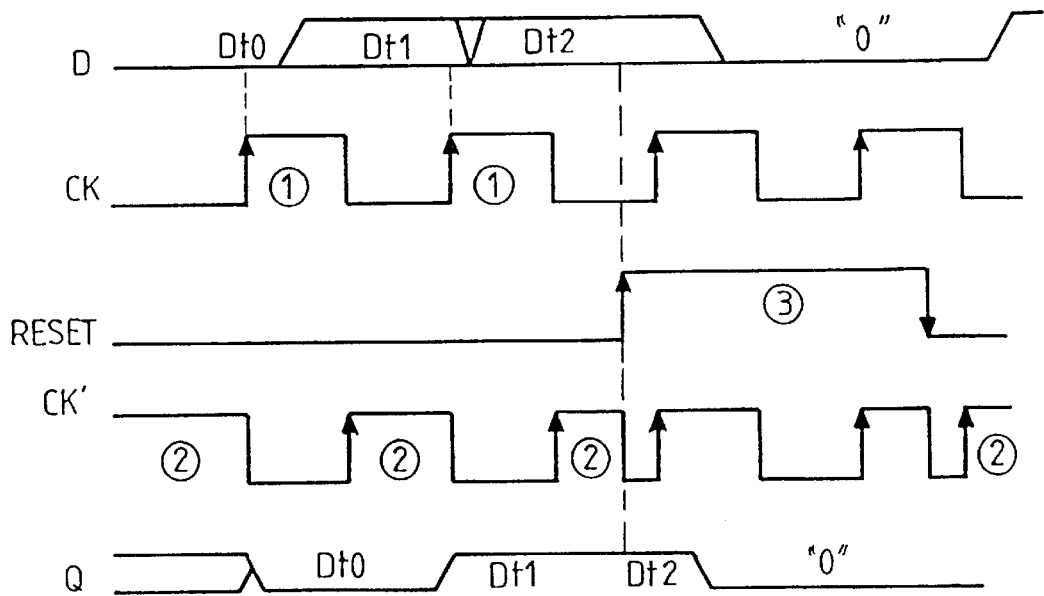

METHOD FOR THE RESETTING OF A SHIFT REGISTER AND ASSOCIATED REGISTER

CROSS REFERENCE TO RELATED APPLICATIONS

This application is a division of application serial number 08/732,601, filed Oct. 16, 1996, now U.S. Pat. No. 5,778,037, entitled METHOD FOR THE RESETTING OF A SHIFT REGISTER AND ASSOCIATED REGISTER, which prior application is incorporated herein by reference.

BACKGROUND OF THE INVENTION

1. Field of the Invention

The present invention relates to the resetting of a group of synchronous and non-transparent memory cells that are series-connected. More particularly, the present invention relates to the resetting of long shift registers, such as those used in cryptographic applications, especially in microcircuit-based cards.

2. Discussion of the Related Art

A non-transparent synchronous cell of a shift register usually has an input stage and an output stage, controlled by means of two clock signals in phase opposition. These clock signals are applied to transfer gates for the transfer of the data elements of each stage. One of the two clock signals activates the holding of a data element in the input stage and its transfer to the output stage. The other clock signal activates the input of a new data element in the input stage and the holding of a previous data element in the output stage.

A shift register is usually reset by the introduction, into each cell, of a circuit capable of imposing a zero at an input when a resetting signal is activated. This circuit generally uses logic gates in synchronization with the control signals for the register. In practice, at least one to two additional transistors must be planned in the input stage and the output stage of each cell to carry out this resetting function. Thus, the resetting circuit soon becomes bulky beyond a certain length of register. For example, in a register with 1024 cells, at least 4096 additional transistors are needed.

Another disadvantage of typical reset circuits is that the synchronizing of the resetting signal with the control signals for the register introduces a delay in the performance of the resetting. Furthermore, this resetting circuit necessitates the conveyance of the signal up to each cell. Beyond a certain length of register, the loss of time that can be attributed to the time of propagation of the active state of the resetting signal to each cell is no longer negligible.

Therefore, it is important, for certain applications of shift registers, to be able to reset their contents almost instantaneously so as not to "expose" the sensitive data contained therein. This is particularly true in the case of cryptographic applications and also for shift registers that work at higher speed.

SUMMARY OF THE INVENTION

It is an object of the present invention to provide a method of resetting that enables an almost instantaneous resetting of the shift register. Another object of the present invention is to provide a circuit for the resetting of a highly compact shift register. A further object of the present invention is a resetting circuit that enables a non-synchronous resetting of the operation of the shift register, thus enabling this resetting to be carried out immediately, without delay.

An embodiment of the invention is directed to a method for the resetting of a group of series-connected non-transparent synchronous memory cells, including transfer gates controlled by at least two clock signals, in phase opposition, to turn certain of these gates off and turn the other gates on and vice versa. According to this embodiment, the method includes the modification of these clock signals upon the activation of a resetting signal to set all the transfer gates in the on state.

A second embodiment of the invention is directed to a shift register comprising series-connected non-transparent synchronous memory cells, controlled by at least two clock signals in phase opposition, said cells including transfer gates each receiving at least one of the two clock signals to be turned off or turned on depending on whether a new data element is memorized in each cell or whether a memorized data element is transferred to the output of each cell. According to this embodiment, the register includes a resetting circuit to make all the cells of said register transparent in a resetting phase, said circuit including at least one logic gate to modify the two clock signals during the active state of a resetting signal.

BRIEF DESCRIPTION OF THE DRAWINGS

Other advantages and characteristics of the invention shall be described in detail in the following description given by way of example with reference to the accompanying drawings, in which:

FIG. 1 shows an exemplary structure of a cell of a shift register with a resetting circuit according to an embodiment of the invention; and FIG. 2 is a timing diagram of the circuit of FIG. 1, showing signals that illustrate normal operation and the resetting phase.

DETAILED DESCRIPTION

FIG. 1 exemplifies a structure of a shift register given purely by way of a non-exhaustive example in order to illustrate the invention.

A synchronous and non-transparent cell of a shift register usually has an input stage 1 and an output stage 2 controlled by at least two clock signals CK and CK' in phase opposition (CK'=/CK). The input stage has one input D and one output node N connected to the input of the output stage. The output of the output stage is referenced Q. These two stages have transfer gates 10, 13, 20, 23 controlled by the two clock signals.

The principle of operation as illustrated in FIG. 2 can be explained as follows:

Phase (1): when the first clock signal CK is active (CK=1), the input stage is insulated from its input D and transmits the previously memorized data element $Dt_0$ on the node N. The output stage transmits this data element on its output Q.

Phase (2): when it is the other clock signal that is active (CK'=1), the input stage memorizes the new data element $Dt_1$ present at its input D, while the output stage is insulated from the node N and holds the data element $Dt_0$ at its output Q.

According to an embodiment of the invention, there is provided a resetting circuit to modify the clock signals CK and CK' during the active state of a resetting signal so as to set the two stages in a transparent mode in order to reset the cell instantaneously with a resetting data element.

In practice, by presenting the resetting data element at the input D of the first cell of a register and then activating the reset signal referenced reset, the resetting circuit sets the two clock signals applied to all the cells in a modified state, so that all the transfer gates of all the cells are on: the cells of the register are then in transparent mode and get reset very soon.

The reset signal no longer has to be propagated: it modifies the clock signals of the register to modify its operation. The resetting time then corresponds essentially to the time taken to transfer the data in a single-phase operating mode of the register (since all the input and output stages are in transfer mode).

In the example shown in FIG. 1, the input stage 1 has a first transfer gate 10 connected to the input D of the cell. The transfer gate 10 is followed by a first inverter 11 whose output forms the output node N of the input stage. The output of the inverter 11 is looped to its input by a second inverter 12 that is series-connected with a second transfer gate 13. The assembly formed by the two inverters and the transfer gate forms a storage loop, with a first inverter 11 having low resistivity (strong) and a second highly resistive inverter 12.

The output stage 2 has a similar structure. The input of the output stage 2 is connected to the node N and transmits the data elements at its output Q. The first transfer gate, the first inverter, the second inverter and the second transfer gate of this output stage are respectively referenced: 20, 21, 22 and 23.

In the example shown, the transfer gates are dual-command gates. They have two parallel-connected MOS transistors with opposite types of conductivity. The transfer gate 10 thus has a P type MOS transistor referenced 10a and an N type MOS transistor referenced 10b. In operational mode, the two transistors of a transfer gate are controlled in phase opposition to be on at the same time and insulating at the same time. Thus, in the example, the transfer gates 10 and 23 receive the clock signal CK at the gate of their P type transistor (10a and 23a) and the clock signal CK' at the gate of their N type transistor (10b and 23b). In this way, these gates are off during the phase (1) for the transfer of the stored data element Dto to the Q output of the output stage. They are on during the phase (2) for the storage of a new data element Dt1 presented at the D input.

The transfer gates 13 and 20 for their part receive the clock signal CK' at the gate of their P type transistor (13a and 20a) and the clock signal CK at the gate of their N type transistor (13b and 20b). In this way, these gates are on during the transfer phase (1) and off during the storage phase (2). The transfer gates 10 and 23 therefore work in reverse to the transfer gates 13 and 20.

According to an embodiment of the invention, it is provided that the activation of a reset signal (reset=1) will modify the two clock signals CK and CK' to set all the transfer gates in the on state: a data element present at input is transmitted directly to the Q output through the gate 10, the inverter 11, the gate 20 and the inverter 21. In the example, it is enough for this purpose to place the clock signals CK and CK' in phase (CK=CK' when reset=1). Indeed, since the transfer gates herein comprise two transistors with opposite types of conductivity, there will always be one that is on: the P type transistor when CK=CK' 0 and the N type transistor when CK=CK'=1.

If the transfer gates were to have only one transistor, it would be necessary, to implement the invention, to set the clock signals CK and CK' in an appropriate state (0 or 1) during the resetting time to turn all the transfer gates on. In practice, to modify the clock signals CK and CK' according to the invention, in order to turn on all the transfer gates of the cells of the register, it is sufficient to use one or more logic gates as a resetting circuit 3.

In the example shown in FIG. 1 where, in order to obtain operation in transparent mode according to the resetting method of the invention, it is necessary to have clock signals CK and CK' in phase during the resetting, and in phase opposition otherwise, it is enough to have a single Exclusive NOR gate as the resetting circuit 3. This gate receives the resetting signal, RESET, and a clock signal (for example CK) as inputs, and delivers the other clock signal (in the example CK') at output. The clock signal used to generate the other is obtained conventionally from a clock signal generating circuit (comprising an oscillator and a divider) that is not shown.

Clearly, changes may be made to the circuit as described and illustrated herein without, however, departing from the scope of the present invention. In particular, the present invention can be applied to all the various shift register structures that set the transfer gates in the on state by modifying the clock signals that control them.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for resetting a plurality of series-connected non-transparent synchronous memory cells, each of the plurality of memory cells having a plurality of transfer gates that are controlled by at least two clock signals, in phase opposition, to turn certain transfer gates of the plurality of transfer gates off and turn remaining transfer gates of the plurality of transfer gates on, the method comprising the steps of:

activating a reset signal; and modifying, responsive to the step of activating, the at least two clock signals to set all the plurality of transfer gates on.

2. The method of claim 1, wherein:

each transfer gate of the plurality of transfer gates includes at least two transistors, a first of the at least two transistors being controlled by a first clock signal of the at least two clock signals, and a second of the at least two transistors being controlled by a second clock signal of the at least two clock signals, the second clock signal being in phase opposition to the first clock signal; and the step of modifying the at least two clock signals puts the second signal in phase with the first clock signal.

* * * * *